(12) United States Patent
Pan et al.

(10) Patent No.: US 8,901,003 B1
(45) Date of Patent: Dec. 2, 2014

(54) POLISHING METHOD OF SEMICONDUCTOR STRUCTURE

(71) Applicant: United Microelectronics Corp., Hsinchu (TW)

(72) Inventors: Ji-Gang Pan, Beijing (CN); Han-Chuan Fang, Singapore (SG); Boon-Tiong Neo, Singapore (SG)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 14/021,419

(22) Filed: Sep. 9, 2013

(51) Int. Cl.
  *H01L 21/302* (2006.01)
  *H01L 21/461* (2006.01)
  *H01L 21/321* (2006.01)
  *H01L 21/02* (2006.01)

(52) U.S. Cl.
  CPC ...... *H01L 21/3212* (2013.01); *H01L 21/02057* (2013.01)
  USPC ............. 438/693; 216/88; 216/89; 438/692

(58) Field of Classification Search
  USPC ............. 216/89, 88; 438/692, 693
  See application file for complete search history.

(56) References Cited

U.S. PATENT DOCUMENTS 7,087,528 B2 * 8/2006 Cheng et al. ............. 438/692
8,187,909 B2   5/2012 Venezia et al.

FOREIGN PATENT DOCUMENTS

WO   2011072495   6/2011

* cited by examiner

*Primary Examiner* — Roberts Culbert
(74) *Attorney, Agent, or Firm* — J.C. Patents

(57) ABSTRACT

A polishing method of a semiconductor device is disclosed. A substrate having a first side and a second side opposite to the first side is provided. The substrate has a device layer formed on the first side and a plurality of trench isolation structures therein extending from the first side to the second side. A main polishing step is performed to the second side of the substrate until a surface of at least one of the trench isolation structures is exposed. An auxiliary polishing step is then performed to the second side of the substrate. Besides, a silicon-to-oxide selectivity of the main polishing step is different from a silicon-to-oxide selectivity of the auxiliary step.

16 Claims, 4 Drawing Sheets

US 8,901,003 B1

POLISHING METHOD OF SEMICONDUCTOR STRUCTURE

BACKGROUND OF THE INVENTION

1. Field of Invention

The present invention relates to an integrated circuit (IC) fabrication, and particularly to a polishing method of a semiconductor structure.

2. Description of Related Art

In a typical CMOS image sensor, photosensitive regions are disposed in a substrate, and a back-end-of-line (BEOL), a color filter array and micro-lenses are disposed on the same side of the substrate. Therefore, light passes not only the micro-lenses and the color filter array but also the BEOL to reach the photosensitive regions disposed in the substrate. Since metal of the BEOL is non-transparent and blocks the light, the amount of the light reaching the pixel array is very limited.

A backside illuminated (BSI) image sensor for detecting the amount of light from the backside of a substrate is thus developed. In the BSI image sensor, a BEOL is disposed on the front side of the substrate, and a color filter array and micro-lenses are disposed on the backside of the substrate. The light is illuminated on the backside of the substrate and only passes the micro-lenses and the color filter, without passing the BEOL, to reach the photosensitive regions. Light blocking of the BEOL is accordingly avoided, and thus, the sensitivity of each unit region is higher and the image quality is improved.

In a conventional backside illumination process, the backside of the substrate is typically thinned by a single chemical mechanical polishing (CMP) process after the BEOL is formed and before the color filter array is formed. However, such single CMP process may cause dishing in trench open areas and is incapable of removing particles effectively in pixel regions, thereby deteriorating the performance of the device.

SUMMARY OF THE INVENTION

Accordingly, the present invention provides a polishing method of a semiconductor structure, by which particle residues are not observed after the substrate thinning step and the device performance is therefore improved.

The present invention provides a polishing method of a semiconductor device. A substrate having a first side and a second side opposite to the first side is provided. The substrate has a device layer formed on the first side and a plurality of trench isolation structures therein extending from the first side to the second side. A main polishing step is performed to the second side of the substrate until a surface of at least one of the trench isolation structures is exposed. An auxiliary polishing step is then performed to the second side of the substrate. Besides, a silicon-to-oxide selectivity of the main polishing step is different from a silicon-to-oxide selectivity of the auxiliary step.

According to an embodiment of the present invention, the silicon-to-oxide selectivity of the main polishing step is equal to or less than about 1:1, and the silicon-to-oxide selectivity of the auxiliary polishing step is equal to or less than about 10:7.

According to an embodiment of the present invention, the main polishing step includes performing a first polishing step with a first polishing agent having a silicon-to-oxide selectivity of equal to or less than about 1:1.

According to an embodiment of the present invention, the auxiliary polishing step includes performing a second polishing step with a second polishing agent having a silicon-to-oxide selectivity of equal to or less than about 1:1, and performing a third polishing step with a third polishing agent having a silicon-to-oxide selectivity of equal to or greater than about 10:1.

According to an embodiment of the present invention, the third polishing step is performed immediately after the second polishing step.

According to an embodiment of the present invention, the second polishing agent is the same as the first polishing agent.

According to an embodiment of the present invention, the second side of the substrate is hydrophilic after the second polishing step but is hydrophobic after the third polishing step.

According to an embodiment of the present invention, a pH value of each of the first, second and third polishing agents is greater than about 7.

According to an embodiment of the present invention, the pH value of the first polishing agent is from about 11 to 12, the pH value of the second polishing agent is from about 11 to 12, and the pH value of the third polishing agent is from about 10 to 11.

According to an embodiment of the present invention, a solids content of the first polishing agent is from about 15 wt % to 20 wt %, a solids content of the second polishing agent is from about 15 wt % to 20 wt %, and a solids content of the third polishing agent is from about 3 wt % to 4 wt %.

According to an embodiment of the present invention, the polishing method further includes performing a pre-polishing step, with a pre-polishing agent, to the second side of the substrate before the main polishing step, wherein the pre-polishing agent has a silicon-to-oxide selectivity of equal to or greater than about 10:1.

According to an embodiment of the present invention, the polishing method further includes performing a cleaning step, with a cleaning agent, to the second side of the substrate after the auxiliary polishing step, wherein the cleaning agent includes $H_2O_2$ in a concentration of about 0.2 wt %-0.4 wt %.

According to an embodiment of the present invention, the substrate includes silicon.

According to an embodiment of the present invention, the trench isolation structures include oxide.

According to an embodiment of the present invention, a polishing pad of the main polishing step is harder than a polishing pad of the auxiliary polishing step.

According to an embodiment of the present invention, a polishing pressure of the main polishing step is higher than a polishing pressure of the auxiliary polishing step.

In view of the above, in the polishing method of the invention, at least main and auxiliary polishing steps with different silicon-to-oxide selectivities are performed to improve the particle removing efficiency. With such method, both oxide (trench isolation structure areas) and silicon (pixel areas) can be polished uniformly to the required depth without residues. Therefore, the performance of the device is improved In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
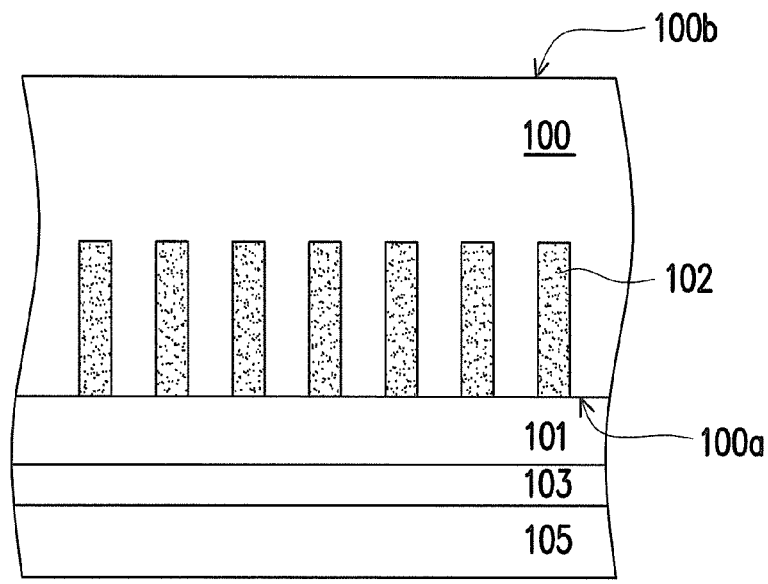
FIG. 1A to FIG. 1E are cross-sectional views illustrating a polishing method of a semiconductor structure according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1A to FIG. 1E are cross-sectional views illustrating a polishing method of a semiconductor structure according to an embodiment of the present invention. FIG. 2 illustrates a process flow of a polishing method of a semiconductor structure according to an embodiment of the present invention.

Figure 2:
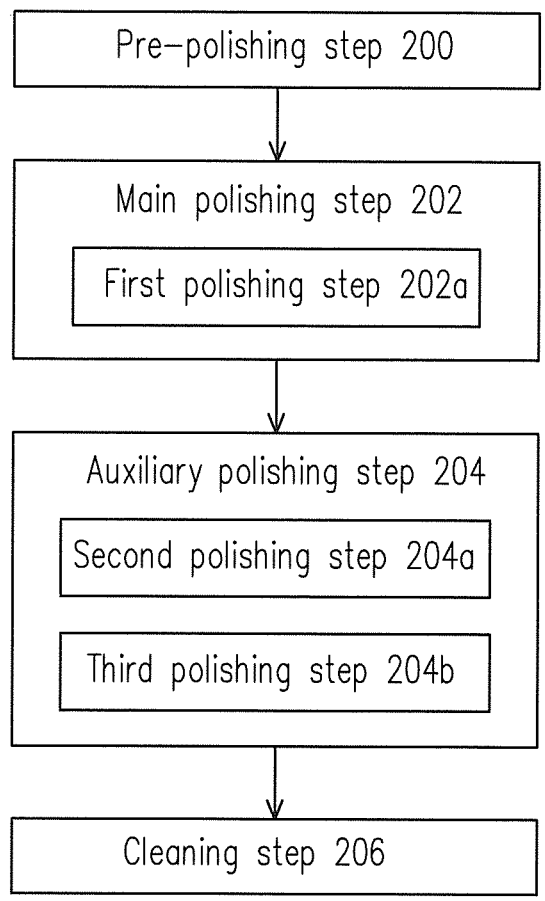
FIG. 2 illustrates a process flow of a polishing method of a semiconductor structure according to an embodiment of the present invention.

Referring to FIG. 1A, a substrate 100 is provided. The substrate 100 includes a semiconductor material, such as silicon. The substrate 100 has a first side (e.g. front side) 100a and a second side (e.g. backside) 100b opposite to the first side 100a. In an embodiment, the substrate 100 has a thickness of about 4.5 to 7.5 μm, such as about 5 μM. Besides, the substrate 100 has a device layer formed on the first side 100a. The device layer may include a back-end-of-line (BEOL) 101 formed by a dielectric layer and a multi-level metal interconnection (not shown). The device layer may further include a gate structure, a pre-metal dielectric (PMD) layer etc. In an embodiment, when the substrate 100 is relatively thin (e.g. 3.4 μm), a carrier substrate 105 is further provided below the BEOL 101 for improving the structural robustness of the BSI image sensor. The carrier substrate 105 can be attached to the BEOL 101 after the BEOL 101 is formed and before the polishing (thinning) process is performed to the substrate 100. A wafer bonding interface 103 may be formed between the BEOL 101 and the carrier substrate 105. In another embodiment (not shown), when the substrate 100 is thick enough (e.g. 5.5 μm), a carrier substrate and a wafer bonding interface are not necessary.

Besides, the substrate 100 further has a plurality of trench isolation structures 102 therein extending from the first side 100a to the second side 100b. The trench isolation structures 102 include oxide, such as silicon oxide. In an embodiment, the trench isolation structures 102 have a substantially uniform depth (e.g. about 2.7 μm), as shown in FIG. 1A. However, the present invention is not limited thereto. In another embodiment (not shown), the depths of the trench isolation structures 102 vary in a range from about 2.0 to 4.0 μm. Besides, the substrate 100 further has a plurality of photosensitive regions (pixel areas) therein. The photosensitive regions are doped regions within the silicon substrate 100.

Figure 1B:
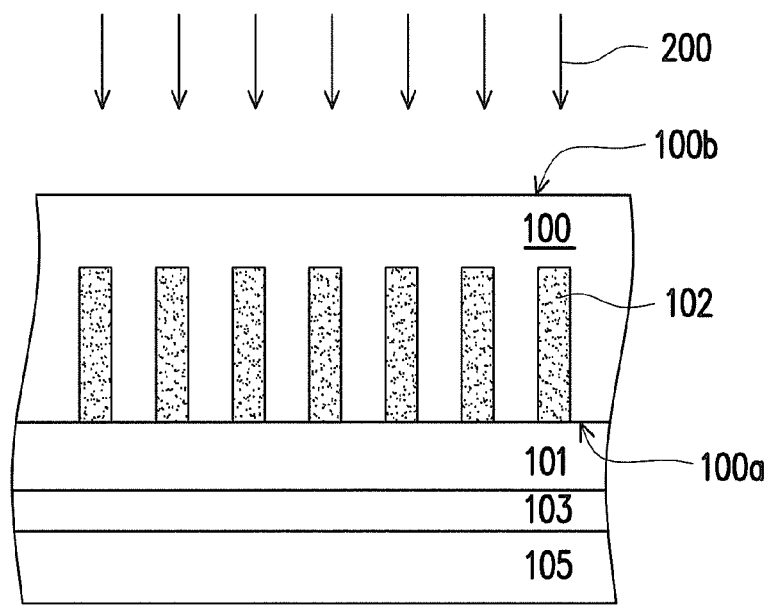

Referring to FIG. 1B and FIG. 2, a pre-polishing step 200 is optionally performed, with a pre-polishing agent (slurry), to the second side 100b of the substrate 100. The pre-polishing agent has a silicon-to-oxide selectivity of equal to or greater than about 10:1. The pH value of the pre-polishing agent is from about 9.5 to 12.5, and the solids content of the same is from about 5 wt % to 30 wt %. Beside, the pre-polishing step 200 is performed with a hard polishing pad under a down force pressure of about >4 psi for about 40 to 80 seconds, for example. The pre-polishing step 200 provides a relatively large etch selectivity of silicon over oxide, so that the silicon substrate 100 can be polished quickly to a pre-determined depth of 2.5-4.0 μm (e.g. about 3.7 μm). The pre-polishing step 200 is an optional step and only required when the incoming substrate is too thick. In other words, the pre-polishing step 200 can be omitted when the incoming substrate is thin enough for the next main polishing step 202.

Figure 1C:
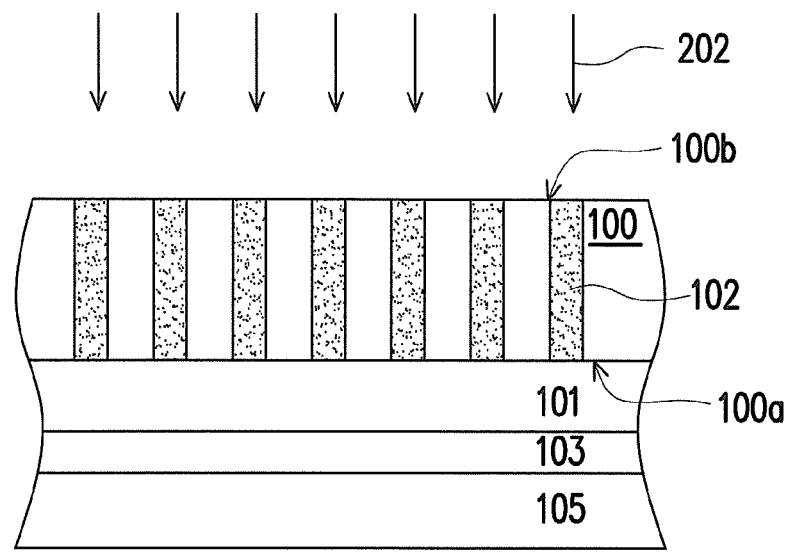

Referring to FIG. 1C and FIG. 2, a main polishing step 202 is performed to the second side 100b of the substrate 100 until the surface of at least one of the trench isolation structures 102 is exposed. The main polishing step 202 includes performing a first polishing step 202a with a first polishing agent having a silicon-to-oxide selectivity of equal to or less than about 1:1. The pH value of the first polishing agent is greater than about 7 (e.g. from about 11 to 12), and the solids content of the same is from about 15 wt % to 20 wt %, such as about 17 wt %. The main polishing step 200 includes using a hard polishing pad to polish the substrate 100. The method includes injecting a first polishing agent on the hard polishing pad while rotating the hard polishing pad so that the first polishing agent is spread out evenly. In an embodiment, a down force pressure of the hard polishing pad is more than about 4.5 psi, and a process time is about 40 to 80 seconds, for example. The hard polishing pad is fabricated using a polymer material having a texture similar to a felt cloth such as a polyurethane doped poly-resin fiber. The poly-resin fiber has a degree of hardness higher than the polyurethane, and the poly-resin fiber is porous while the polyurethane is non-porous. Therefore, particular hardness and porosity requirements can be met by adjusting the ratio between the two compounds. In an embodiment, the hard polishing pad is purchased from Rohm and Haas.

Figure 1D:
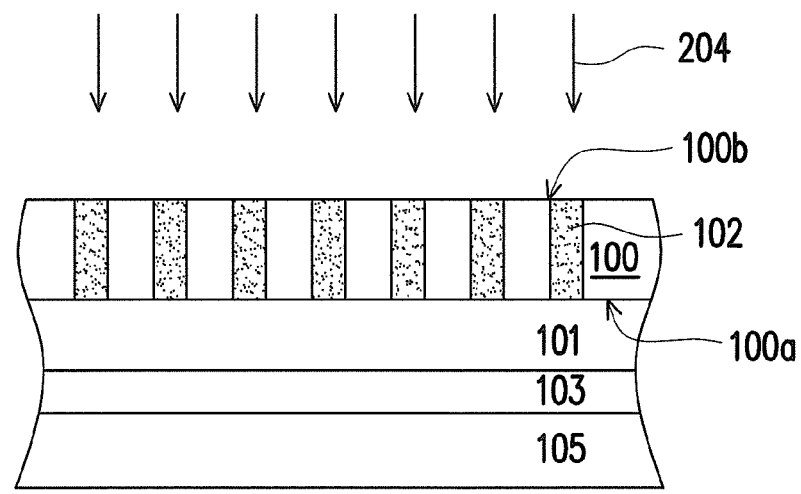

Referring to FIG. 1D and FIG. 2, an auxiliary polishing step 204 is performed to the second side 100b of the substrate 100. The substrate 100 can be polished to a target depth of 2.0-3.5 μm (e.g. about 2.3 μm) after the auxiliary polishing step 204. In this step, both oxide (trench isolation structure areas) and silicon (pixel areas) can be polished uniformly to the required depth.

The silicon-to-oxide selectivity of the auxiliary polishing step 204 is different from the silicon-to-oxide selectivity of the main polishing step 202. In an embodiment, the silicon-to-oxide selectivity of the auxiliary polishing step 204 is equal to or less than about 10:7. In this embodiment, the auxiliary polishing step 204 includes performing a second polishing step 204a and a third polishing step 204b in the same polishing station.

The second polishing step 204a is performed with a second polishing agent. In an embodiment, the second polishing agent can be the same as the first polishing agent. Specifically, the second polishing agent has a silicon-to-oxide selectivity of equal to or less than about 1:1, a pH value of greater than about 7 (e.g. about 11 to 12), and a solids content of about 15 wt % to 20 wt % (e.g. about 17 wt %). In another embodiment, the second polishing agent can be different from the first polishing agent upon the process requirements. The second polishing step 204a includes using a soft polishing pad to polish the substrate 100. The method includes injecting a second polishing agent on the soft polishing pad while rotating the soft polishing pad so that the second polishing agent is spread out evenly. In an embodiment, a down force pressure of the soft polishing pad is about less than about 2 psi, and a process time is about 30 to 40 seconds, for example. The material of the soft polishing pad can be Polytex available from Rohm and Haas. The soft polishing pad can have a density less than 0.8 g/cm$^3$ or a hardness less than 50 SHORE D, such as polyethylene. Besides, the soft polishing pad can be a Politex embossed pad available from Rodel.

The third polishing step 204b is performed with a third polishing agent. The third polishing agent has a silicon-to-oxide selectivity of equal to or less than about 10:1, a pH value of greater than about 7 (e.g. about 10 to 11), and a solids content of about 3 wt % to 4 wt % (e.g. about 3.4 wt %). The third polishing step 204b includes using a soft polishing pad to polish the substrate 100. The method includes injecting a third polishing agent on the soft polishing pad while rotating the soft polishing pad so that the third polishing agent is spread out evenly. In an embodiment, a down force pressure of the soft polishing pad is about less than about 2 psi, and a process time is about 30 to 40 seconds, for example. The soft polishing pad used in the third polishing step 204b can be the same as that used in the second polishing step 204a.

In view of the above, on one hand, the main and auxiliary polishing steps 202 and 204 have similar pH values to prevent pH shock and cross contamination. On the other hand, the main and auxiliary polishing steps 202 and 204 provide different silicon-to-oxide selectivities and use different polishing pads under different polishing pressures to improve the particle removing efficiency. Specifically, the silicon-to-oxide selectivity of main polishing step 202 is less than that of the auxiliary polishing step 204, the polishing pad of the main polishing step 202 is harder than that of the auxiliary polishing step 204, and the polishing pressure of the main polishing step 202 is higher than that of the auxiliary polishing step 204.

It is noted that the third polishing step 204b is performed immediately after the second polishing step 204a without any cleaning step therebetween. In such manner, the abrasive particles (e.g. aluminum oxide, silicon oxide or cerium oxide) of the second polishing step 204a can be continuously used in the third polishing step 204b to keep the oxide rate. Thus, the auxiliary polishing step 204 including the second and third polishing steps 204a and 204b can together provide a silicon-to-oxide selectivity of equal to or less than about 10:7.

Besides, the second side 100b of the substrate 100 is hydrophilic after the second polishing step 204a but is hydrophobic after the third polishing step 204b. In an embodiment, the water contact angle is about 58 degrees after the second polishing step 204a but becomes to about 7 degrees after the third polishing step 204b. The hydrophobic surface is beneficial to the next cleaning step 206.

Figure 1E:
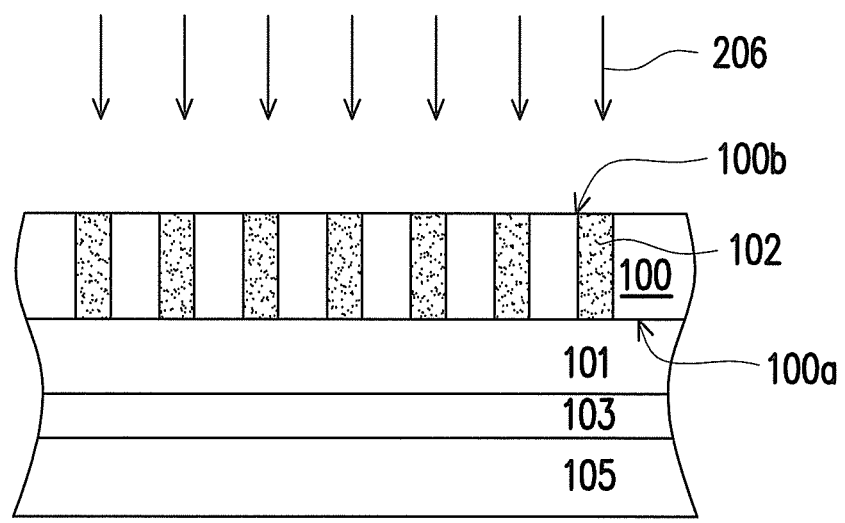

Referring to FIG. 1E and FIG. 2, a cleaning step 206 is performed, with a cleaning agent, to the second side 100b of the substrate 100 after the auxiliary polishing step 204. The cleaning agent may include $H_2O_2$ in a concentration of 0.2 wt %-0.4 wt %. Besides, the process time is about 40 to 80 seconds, for example. At this time point, the polishing method of the present invention is completed. Additional process steps can be continued to add components such as anti-reflective layer, a color filter array and micro-lenses to the second side 100b of the substrate 100 after the cleaning step 206 so as to form a BSI image sensor. These additional process steps are known to persons skilled in the art, and the details are not iterated herein.

In summary, the present invention provides a polishing method of a semiconductor device, which can be applied to a substrate thinning step of the BSI image sensor after the BEOL is formed and before the color filter array is formed. However, the present invention is not limited thereto. The method of the invention can also be applied to any polishing step as long as both oxide areas and silicon areas are required to be polished uniformly to the required depth without residues. With the method of the invention, the thickness of the substrate can be reduced to about 2.3 µm, thereby significantly reducing the amount of silicon through which incident light passes, increasing the sensitivity of each unit region and improving the image quality.

Besides, in the multi-step polishing method of the invention, the main and auxiliary polishing steps have similar pH values to prevent pH shock and cross contamination, but have different silicon-to-oxide selectivities to improve the particle removing efficiency. As compared to the conventional single CMP process, the multi-step polishing method of the invention can effectively remove particles in pixel regions and therefore improve the performance of the device.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. A polishing method of a semiconductor device, comprising:
    providing a substrate having a first side and a second side opposite to the first side, wherein the substrate has a device layer formed on the first side and a plurality of trench isolation structures therein;
    performing a main polishing step to the second side of the substrate until a surface of at least one of the trench isolation structures is exposed; and
    performing an auxiliary polishing step to the second side of the substrate,
    wherein a silicon-to-oxide selectivity of the main polishing step is different from a silicon-to-oxide selectivity of the auxiliary step.

2. The polishing method of claim 1, wherein the silicon-to-oxide selectivity of the main polishing step is equal to or less than 1:1, and the silicon-to-oxide selectivity of the auxiliary polishing step is equal to or less than 10:7.

3. The polishing method of claim 1, wherein the main polishing step comprises performing a first polishing step with a first polishing agent having a silicon-to-oxide selectivity of equal to or less than 1:1.

4. The polishing method of claim 3, wherein the auxiliary polishing step comprises:
    performing a second polishing step with a second polishing agent having a silicon-to-oxide selectivity of equal to or less than 1:1; and
    performing a third polishing step with a third polishing agent having a silicon-to-oxide selectivity of equal to or greater than 10:1.

5. The polishing method of claim 4, wherein the third polishing step is performed immediately after the second polishing step.

6. The polishing method of claim 4, wherein the second polishing agent is the same as the first polishing agent.

7. The polishing method of claim 4, wherein the second side of the substrate is hydrophilic after the second polishing step but is hydrophobic after the third polishing step.

8. The polishing method of claim 4, wherein a pH value of each of the first, second and third polishing agents is greater than 7.

9. The polishing method of claim 8, wherein the pH value of the first polishing agent is from 11 to 12, the pH value of the second polishing agent is from 11 to 12, and the pH value of the third polishing agent is from 10 to 11.

10. The polishing method of claim 4, wherein a solids content of the first polishing agent is from 15 wt % to 20 wt %, a solids content of the second polishing agent is from 15 wt % to 20 wt %, and a solids content of the third polishing agent is from 3 wt % to 4 wt %.

11. The polishing method of claim 1, further comprising performing a pre-polishing step, with a pre-polishing agent, to the second side of the substrate before the main polishing step, wherein the pre-polishing agent has a silicon-to-oxide selectivity of equal to or greater than 10:1.

12. The polishing method of claim 1, further comprising performing a cleaning step, with a cleaning agent, to the second side of the substrate after the auxiliary polishing step, wherein the cleaning agent comprises $H_2O_2$ in a concentration of 0.2 wt %-0.4 wt %.

13. The polishing method of claim 1, wherein the substrate comprises silicon.

14. The polishing method of claim 1, wherein the trench isolation structures comprise oxide.

15. The polishing method of claim 1, wherein a polishing pad of the main polishing step is harder than a polishing pad of the auxiliary polishing step.

16. The polishing method of claim 1, wherein a polishing pressure of the main polishing step is higher than a polishing pressure of the auxiliary polishing step.

\* \* \* \* \*